(12) United States Patent
Tanaka et al.

(10) Patent No.: US 7,453,704 B2
(45) Date of Patent: Nov. 18, 2008

(54) PRINTED WIRING BOARD AND INFORMATION PROCESSING APPARATUS

(75) Inventors: Makoto Tanaka, Ome (JP); Yuichi Koga, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

(21) Appl. No.: 11/404,771

(22) Filed: Apr. 17, 2006

(65) Prior Publication Data

US 2006/0231912 A1   Oct. 19, 2006

(30) Foreign Application Priority Data

Apr. 18, 2005   (JP) .............................. 2005-119579

(51) Int. Cl.
*H05K 7/00*   (2006.01)
(52) U.S. Cl. ...................... 361/760; 361/764
(58) Field of Classification Search ................ 361/760, 361/764, 770; 257/459, 686
See application file for complete search history.

(56) References Cited

U.S. PATENT DOCUMENTS

| 6,862,192 | B2 | 3/2005 | Yashiro | |
|---|---|---|---|---|
| 6,958,538 | B1* | 10/2005 | Lauterbach et al. | 257/723 |
| 7,034,387 | B2* | 4/2006 | Karnezos | 257/686 |
| 2002/0079568 | A1* | 6/2002 | Degani et al. | 257/686 |
| 2004/0238209 | A1* | 12/2004 | Yuri et al. | 174/257 |
| 2004/0264103 | A1* | 12/2004 | Otsuka et al. | 361/306.1 |

FOREIGN PATENT DOCUMENTS

| JP | 2001-339037 | 12/2001 |
|---|---|---|
| JP | 2003-218505 | 7/2003 |

OTHER PUBLICATIONS

Japanese Office Action dated Feb. 28, 2006 for Appln. No. 2003-054681.

* cited by examiner

*Primary Examiner*—Dean A. Reichard
*Assistant Examiner*—Yuriy Semenenko
(74) *Attorney, Agent, or Firm*—Pillsbury Winthrop Shaw Pittman, LLP

(57) ABSTRACT

According to one embodiment, a printed wiring board includes, a main body including an obverse side with an obverse wiring layer, and a reverse side with a reverse wiring layer first pads provided on the obverse side in a first region defined thereon, and to be connected to terminals arranged on a surface of a first semiconductor chip, second pads provided on the reverse side in a second region defined thereon and overlapping with the first region, and to be connected to terminals arranged on a surface of a second semiconductor chip, and interlayer wiring electrically connecting those of the first pads, which are located in an overlapping region, to those of the second pads which are located in the overlapping region.

2 Claims, 6 Drawing Sheets

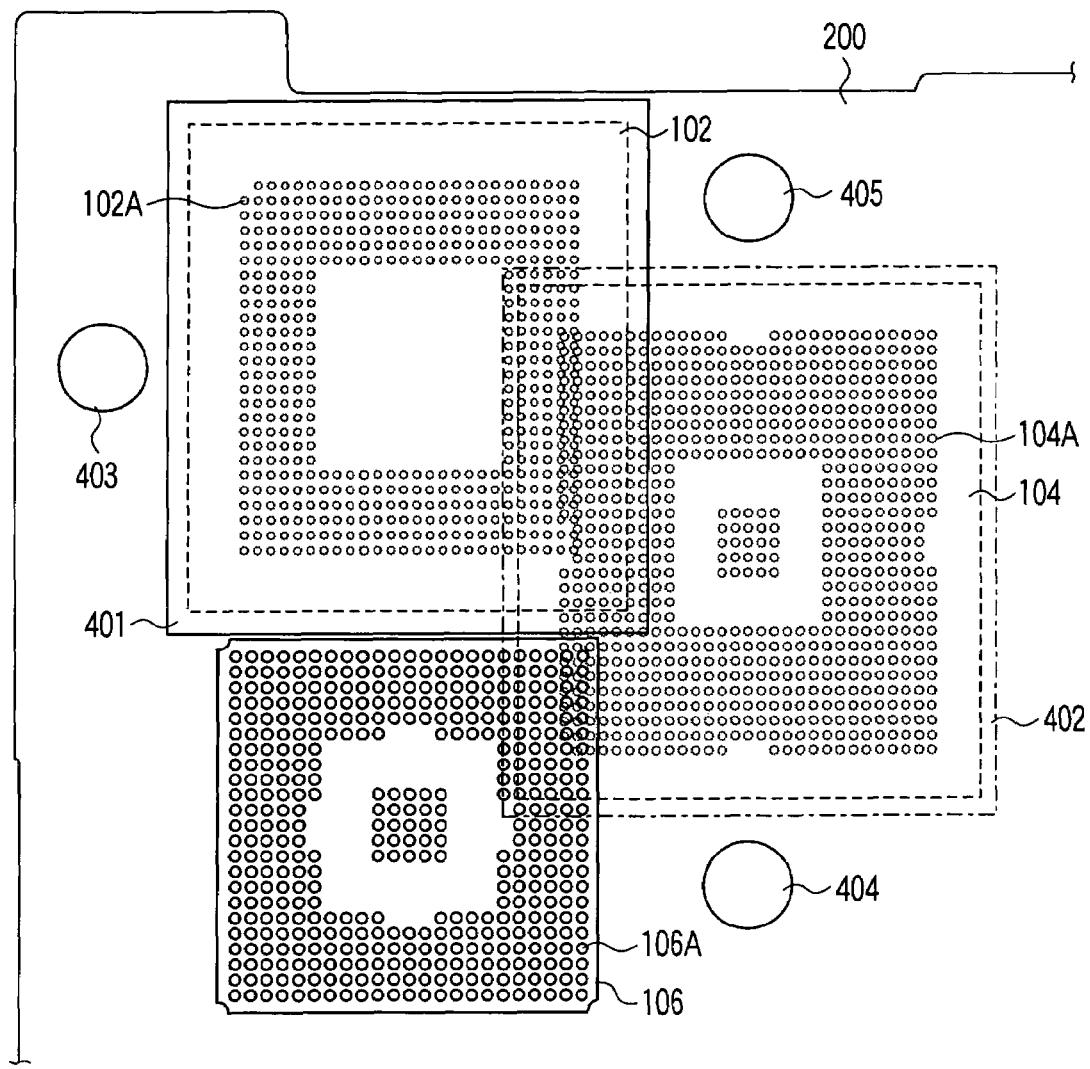
F I G. 11

PRINTED WIRING BOARD AND INFORMATION PROCESSING APPARATUS

CROSS-REFERENCE TO RELATED APPLICATIONS

This application is based upon and claims the benefit of priority from Japanese Patent Application No. 2005-119579, filed Apr. 18, 2005, the entire contents of which are incorporated herein by reference.

BACKGROUND

1. Field

One embodiment of the invention relates to a printed wiring board capable of mounting semiconductor chips on each side thereof, and an information processing apparatus with the printed wiring board.

2. Description of the Related Art

Attention has recently been paid to techniques for mounting electronic components, such as a semiconductor chip and resistor, on a printed circuit. In accordance with the development of size reduction of information processing apparatuses, printed wiring boards for mounting thereon electronic components, such as a semiconductor chip and resistor, have been reduced in size. To reduce the size of the printed wiring boards, electronic components have been subjected to size reduction and/or highly integrated. Further, a double-sided mounting technique for mounting electronic components on both sides of a printed wiring board to further reduce the size of the board has been proposed (see Jpn. Pat. Appln. KOKAI Publication No. 2001-339037).

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 11 is an exemplary view illustrating a state in which first and second radiation mechanisms are mounted on the CPU and north bridge, respectively.

DETAILED DESCRIPTION

Various embodiments according to the invention will be described hereinafter with reference to the accompanying drawings. In general, according to one embodiment of the invention, a printed wiring board comprises, a main body including an obverse side with an obverse wiring layer, and a reverse side with a reverse wiring layer; first pads provided on the obverse side in a first region defined thereon, and to be connected to terminals arranged on a surface of a first semiconductor chip second pads provided on the reverse side in a second region defined thereon and overlapping with the first region, and to be connected to terminals arranged on a surface of a second semiconductor chip; and interlayer wiring electrically connecting those of the first pads, which are located in an overlapping region, to those of the second pads which are located in the overlapping region.

Figure 1:
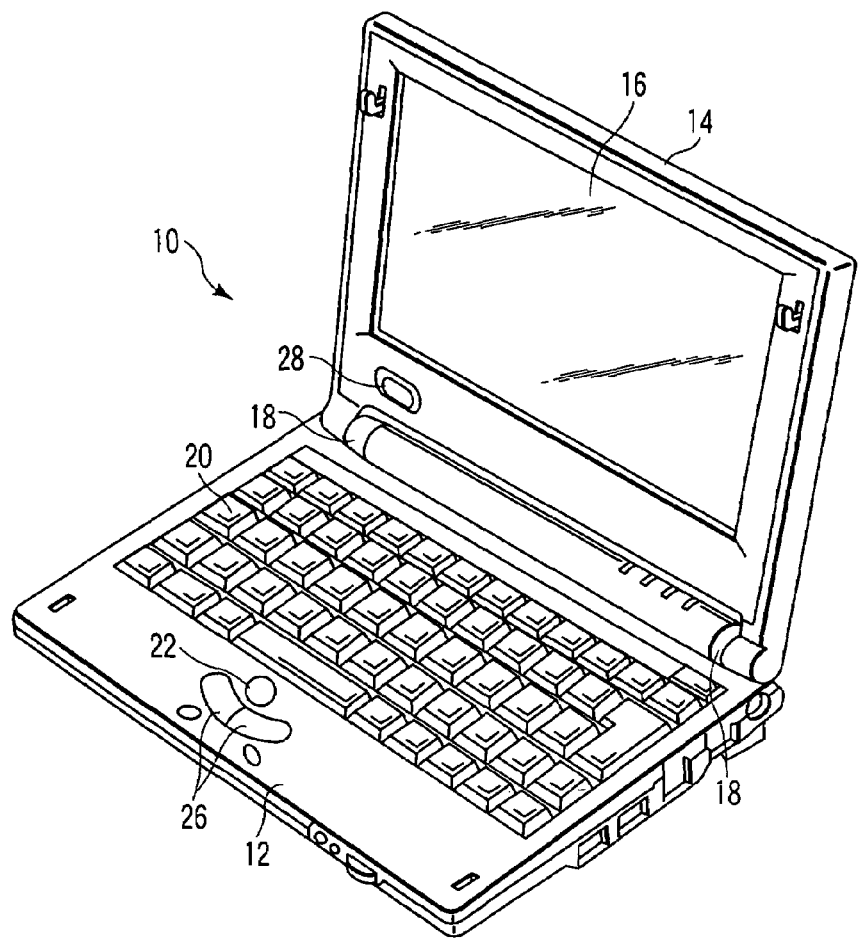
FIG. 1 is an exemplary schematic perspective view illustrating a personal computer according to an embodiment of the invention.

FIG. 1 shows an exemplary notebook personal computer as an information processing apparatus according to the embodiment of the invention.

As shown, the personal computer comprises a computer proper 12 and display unit 14.

The display unit 14 is attached to the computer proper 12 by hinges (support sections) 18 provided on the rear end of the computer proper 12. The display unit 14 can pivot about the hinges between a closed position in which it covers the upper surface of the computer proper 12, and an open position in which the upper surface of the computer proper 12 is exposed. The display unit 14 incorporates a liquid crystal display (LCD) panel 16 for displaying, on its display area, an image in accordance with a panel-driving signal.

The computer proper 12 has a box-shaped case, and a keyboard 20 is provided at the central portion of the upper surface of the case. A palm rest is provided at the front portion of the upper surface of the case. A mouse pointer 22 and control button 26 for moving a pointer displayed on the LCD 16 are provided on the substantially central portion of the palm rest. A power button 28 for turning on/off the computer proper 12 is provided on the lower frame portion of the display unit 14.

Figure 2:
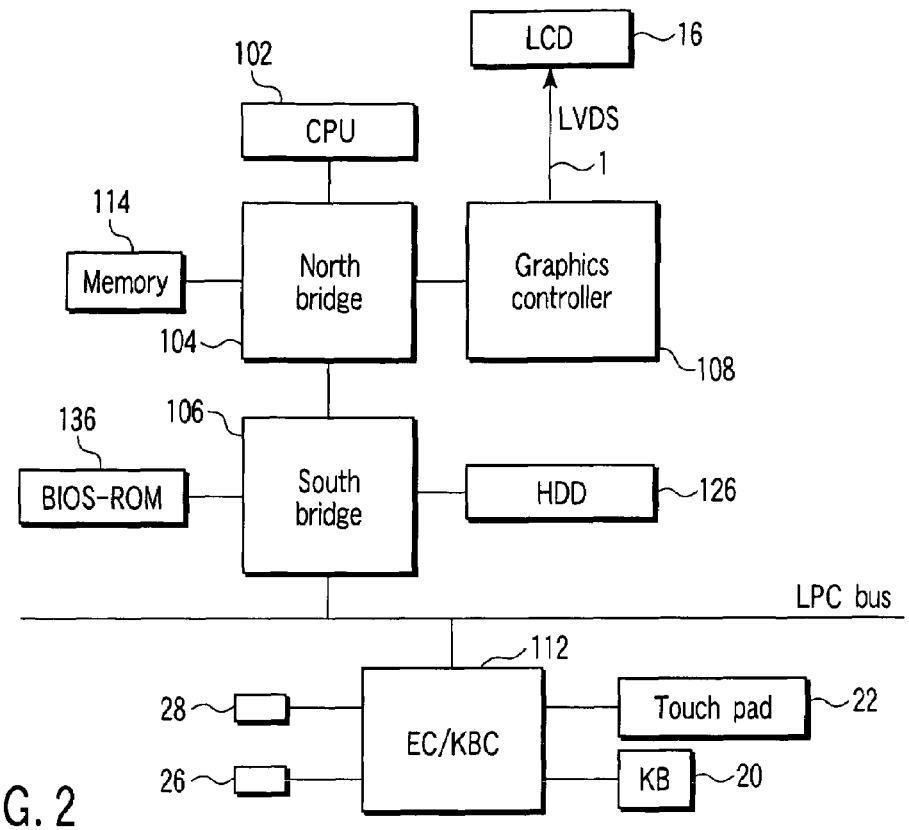
FIG. 2 is an exemplary block diagram illustrating the circuit configuration of the personal computer of the embodiment.

As shown in FIG. 2, the personal computer comprises a central processing unit (CPU) 102, north bridge 104, main memory 114, graphics controller 108, BIOS-ROM 136, hard disk drive (HDD) 126 and embedded-controller/keyboard-controller IC (EC/KBC) 112.

The CPU 102 is a processor for controlling the operation of the computer proper 12, and is configured to execute an operating system (OS) and various application programs read from the HDD 126 and loaded into the main memory 114. Further, the CPU 102 reads a basic input output system (BIOS) from the BIOS-ROM 136, then loads it into the main memory 114, and executes it. The system BIOS is a program for hardware control.

The north bridge 104 is a bride device that connects the local bus of the CPU 102 to the south bridge 106. The north bridge 104 also incorporates a memory controller for controlling access to the main memory 114. The north bridge 104 also has a function for communicating with the graphics controller 108 via, for example, a bus.

The graphics controller 108 is a display controller for controlling the LCD 16 used as the display monitor of the computer. The graphics controller 108 includes a video memory (VRAM), and generates a video signal, indicating a display image to be displayed on the LCD 16, from display data stored in the video memory using the OS/application program. The video signal generated by the graphics controller 108 is output to a line 1.

The EC/KBC 112 performs control for turning on/off the computer in accordance with the power button 28. The EC/KBC 112 controls the keyboard (KB) 20, mouth point 22 and control button 26 under the control of the CPU 102.

A Packaging of the CPU 102, north bridge 104 and south bridge 106 is ball grid array package with solder balls. When the CPU 102, for example, is mounted on a printed wiring board, the CPU 102 is placed on pads arranged two-dimensionally on the printed wiring board, and then fixed thereon using the solder balls melted and re-solidified by reflowing.

Figure 3:
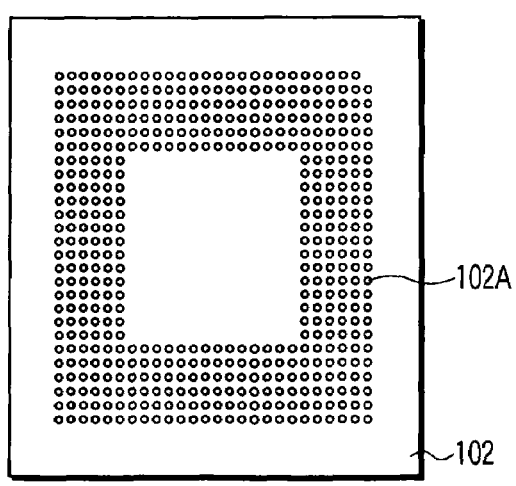
FIG. 3 is an exemplary plan view illustrating the backside of a CPU employed in the embodiment.

More specifically, as shown in FIG. 3, a packaging of the CPU 102 is a ball grid array package with solder balls (terminals) 102A that are arranged two-dimensionally. Further, as shown in FIG. 4, a packaging of the north bridge 104 is a ball grid array package with solder balls (terminals) 104A that are arranged two-dimensionally.

Figure 4:
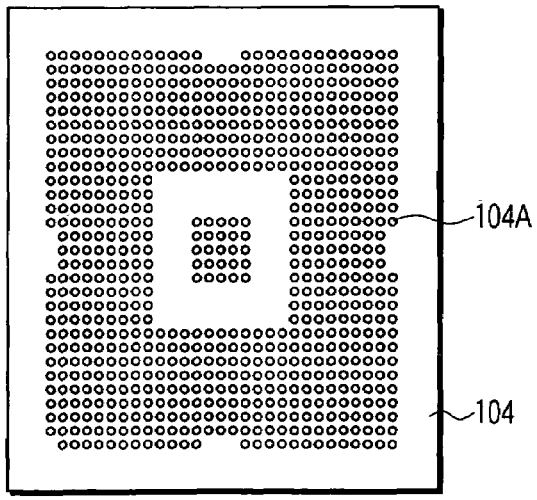
FIG. 4 is an exemplary plan view illustrating the backside of a north bridge employed in the embodiment.
Figure 5:
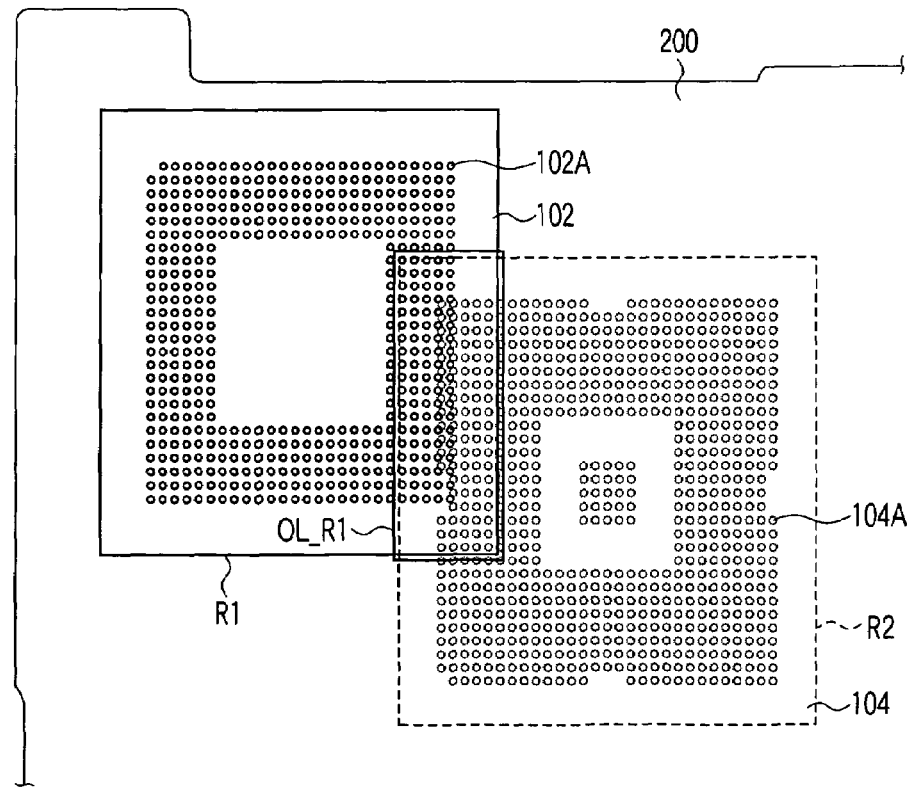
FIG. 5 is an exemplary view illustrating a state in which the CPU and north bridge are mounted on the respective sides of a printed wiring board.

Part of the solder balls 102A of the CPU 102 shown in FIG. 3 are connected to part of the solder balls 104A of the north bridge 104 shown in FIG. 4 via a special high-speed bus (not shown). In the embodiment, the CPU 102 is mounted on the obverse side of a printed wiring board 200 in a first region R1 defined thereon, and the north bridge 104 is mounted on the reverse side of the printed wiring board 200 in a second region R2 defined thereon and overlapping with the first region R1, as is shown in FIG. 5. To shorten the length of the high-speed bus (wiring) connecting the CPU 102 to the north bridge 104, at least part of the solder balls 102A of the CPU 102 and at least part of the solder balls 104A of the north bridge 104 are located within a first overlapping region OL_R1 in which the first and second regions R1 and R2 overlap with each other.

Since at least part of the solder balls 102A for connection and at least part of the solder balls 104A for connection are thus located in the first overlapping region OL_R1, the wiring can be shortened. In general, to prevent signal delay, a high-speed bus including a plurality of signal lines needs to be subjected to wiring length matching for making the lengths of the wires fall within an allowable range. If the CPU and north bridge do not overlap with each other, the matching reference wiring length is 100 mm, and the matching allowable range is ±10 mm. Accordingly, the lengths of the wires must be adjusted to 90 to 110 mm. In general, the wires must be adjusted for wiring length matching, which inevitably increases the area required for wiring.

In the embodiment, since the wires have short lengths, the matching reference wiring length is 10 mm. If the matching allowable range is set to the same value, i.e., ±10 mm, as in the case where the matching reference wiring length is 100 mm, it is sufficient if the lengths of the wires are adjusted to 0 to 20 mm. Thus, the required wiring area and hence the required printed wiring board area can be reduced.

To reduce the wiring area, it is preferable to mount the CPU 102 and north bridge 104 so that at least part of the solder balls 102A overlap with at least part of the solder balls 104A.

Figure 6:
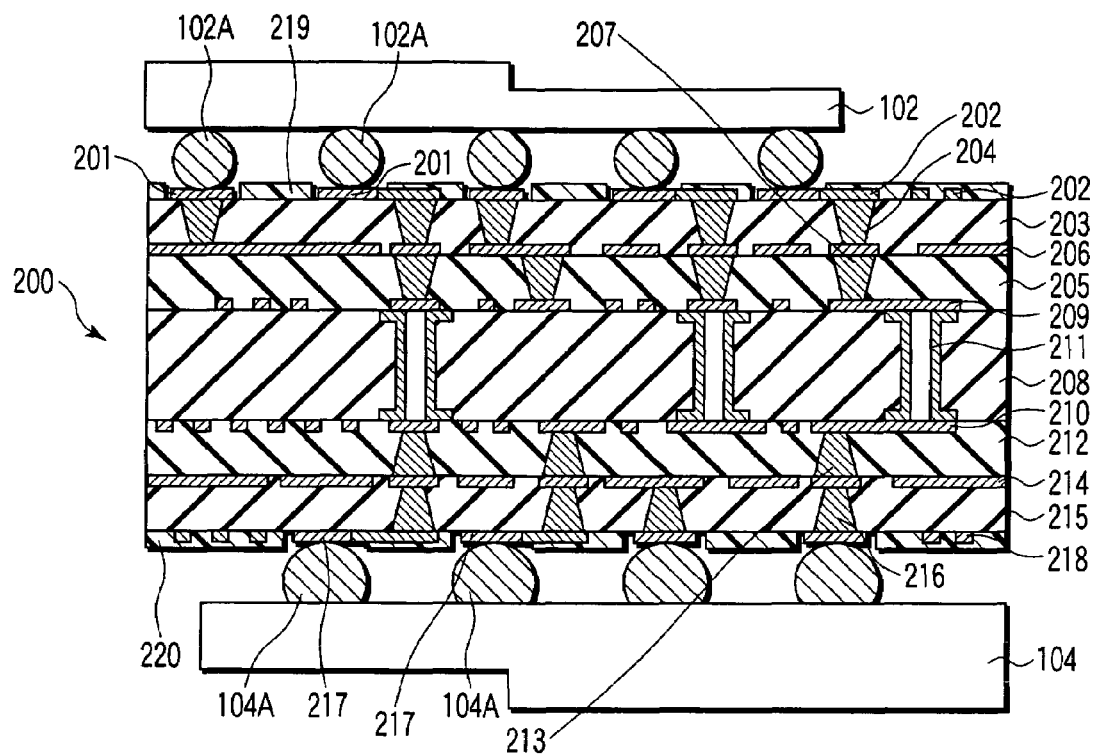
FIG. 6 is an exemplary sectional view illustrating a first overlapping region OL_R1 on the printed wiring board, in which the CPU and north bridge overlap with each other.

FIG. 6 shows the cross section of the first overlapping area OL_R1. The CPU 102 is mounted, via the solder bales 102A, on a plurality of first pads 201 provided on the printed wiring board 200, whereby the solder balls 102A are electrically connected to the first pads 201. A first wiring layer (surface wiring layer) 202 is provided on the surface of the printed wiring board 200. The first pads 201 are electrically connected to portions of the first wiring layer 202. The first pads 201 and first wiring layer 202 are formed on a first insulation substrate 203.

The first insulation substrate 203 contains first blind via plugs (first interlayer wiring) 204 connected to the first pads 201 or first wiring layer 202. The first insulation substrate 203 is formed on a second insulation substrate 205. A second wiring layer (first interlayer wiring) 206 is interposed between the first insulation substrate 203 and the second insulation substrate 205. Portions of the second wiring layer 206 are connected to the first blind via plugs 204.

First buried via plugs (first interlayer wiring) 207 connected to the second wiring layer 206 are formed in the second insulation substrate 205. The second insulation substrate 205 is provided on a base insulation substrate 208 with a third wiring layer (first interlayer wiring) 209 interposed therebetween. Part of the third wiring layer 209 is connected to the first buried via plugs 207. A fourth wiring layer (first interlayer wiring) 210 is provided on the reveres surface of the base insulation substrate 208. Base via plugs (first interlayer wiring) 211 that connect the third wiring layer 209 to the fourth wiring layer 210 are provided in the base insulation substrate 208. The base insulation substrate 208 is provided on a third insulation substrate 212.

Second buried via plugs (first interlayer wiring) 213 connected to portions of the fourth wiring layer 210 are provided in the third insulation substrate 212. A fifth wiring layer (first interlayer wiring) 214 is provided on the reverse side of the third insulation substrate 212. Portions of the fifth wiring layer 214 are connected to the second buried via plugs 213. The third insulation layer 212 is provided on a fourth insulation substrate 215 with the fifth wiring layer 214 interposed therebetween.

Second blind via plugs (first interlayer wiring) 216 are formed in the fourth insulation substrate 215. The second blind via plugs 216 are connected to portions of the fifth wiring layer 214. A plurality of second pads 217 and a sixth wiring layer (reverse wiring layer) 218 are provided on the reverse side of the fourth insulation substrate 215. The north bridge 104 are mounted on the second pads 217. First and second coating layers 219 and 220 are provided on the obverse and reverse sides of the printed wiring board 200, respectively.

As shown in FIG. 6, in the first overlapping region OL_R1, at least part of the first pads 201 are electrically connected to at least part of the second pads 217 via the first wiring layer 202, first blind via plugs 204, second wiring layer 206, first buried via plugs 207, third wiring layer 209, base via plugs 211, fourth wiring layer 210, fifth wiring layer 209, second buried via plugs 213, fifth wiring layer 214, second blind via plugs 216 and sixth wiring layer 218.

Further, at least in the overlapping region OL_R1, the first pads 201 are connected to the first blind via plugs 204 directly or via the first wiring layer 202, and connected to no through via plugs. Similarly, at least in the overlapping region OL_R1, the second pads 217 are connected to the second blind via plugs 216 directly or via the sixth wiring layer 218, and connected to no through via plugs.

As shown in FIG. 6, the printed wiring board of the embodiment has a stacked structure. In a conventional printed wiring board using through via plugs, semiconductor chips of different pitches cannot be mounted on the respective sides of a board so that they overlap with each other. In contrast, in the embodiment using the printed wiring board 200 of a stacked structure, semiconductor chips of different pitches can be mounted on the respective sides of the board so that they overlap with each other.

A description will now be given of a structure for further reducing the required area of the printed wiring board 200.

Figure 7:
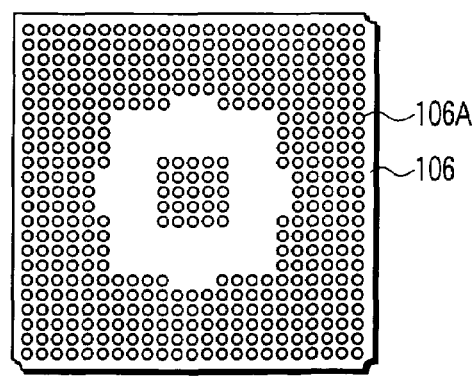
FIG. 7 is an exemplary plan view illustrating the backside of a south bridge employed in the embodiment.
Figure 8:
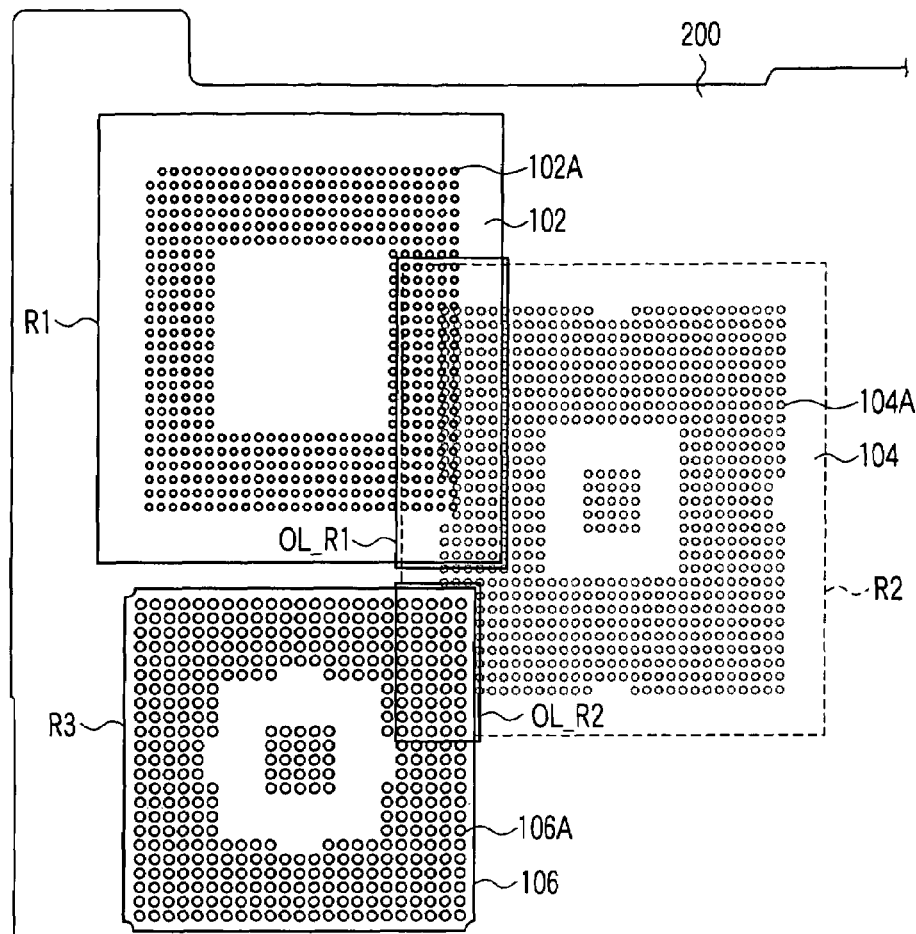
FIG. 8 is an exemplary view illustrating a state in which the south bridge and north bridge are mounted on the respective sides of a printed wiring board.

The north bridge 104 is connected to the south bridge 106 as shown in FIG. 2. More specifically, part of solder balls 106A provided two-dimensionally on the reverse side of the south bridge (third semiconductor chip) 106 and shown in FIG. 7 are electrically connected via a dedicated high-speed bus to part of the solder balls 104A of the north bridge 104 shown in FIG. 4. Subsequently, the south bridge 106 is mounted on the printed wiring board 200 in a third region R3 defined thereon and overlapping with the north bridge 104, as is shown in FIG. 8. To reduce the length of a high-speed bus (wiring) connecting the north and south bridges 104 and 106, at least part of the solder balls 104A of the north bridge 104 and at least part of the solder balls 106A of the south bridge 106 are located in a second overlapping region OL_R2 in which the second and third regions R2 and R3 overlap with each other. By virtue of this structure, the lengths of the wires can be reduced.

Figure 9:
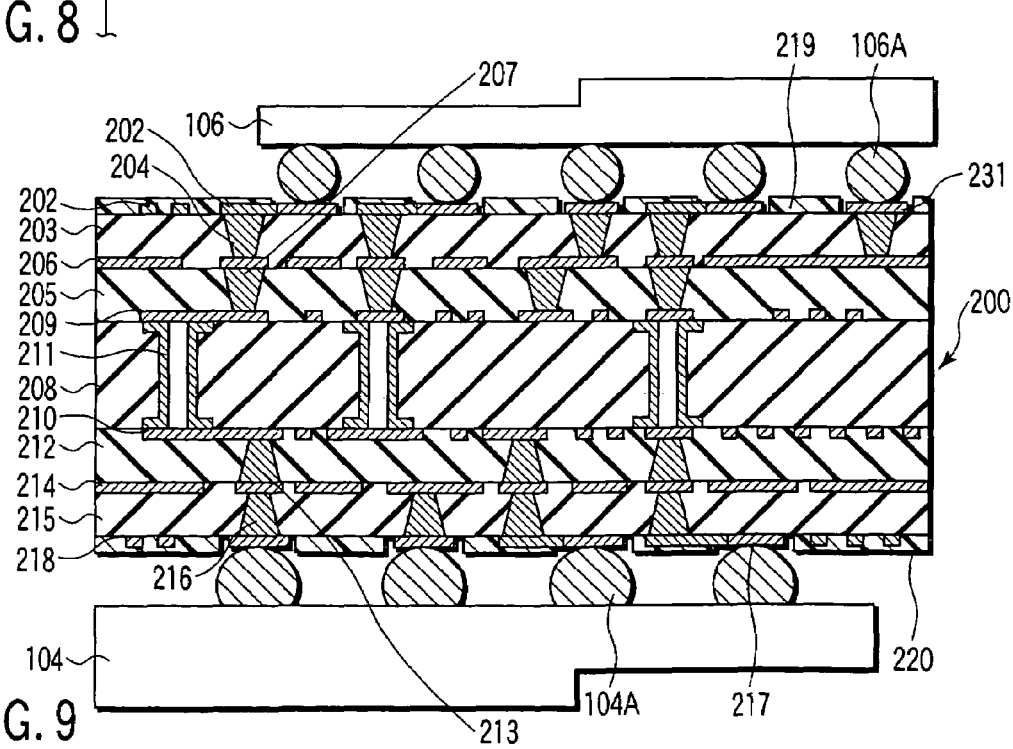
FIG. 9 is an exemplary sectional view illustrating a second overlapping region OL_R2 on the printed wiring board, in which the south bridge and north bridge overlap with each other.

FIG. 9 shows the cross section of the second overlapping area OL_R2. In FIGS. 6 and 9, like reference numeral denote like elements, and no detailed description is given thereof.

As shown in FIG. 9, the south bridge 106 is connected via the solder balls 106A to third pads 231 provided on the printed wiring board. In the second overlapping region OL_R2, at least part of the first pads 201 are electrically connected to at least part of the third pads 231 via the first wiring layer 202, first blind via plugs 204, second wiring layer 206, first buried via plugs 207, third wiring layer 209, base via plugs 211, fourth wiring layer 210, fifth wiring layer 209, second buried via plugs 213, fifth wiring layer 214, second blind via plugs 216 and sixth wiring layer 218.

Further, as shown in FIG. 2, the north bridge 104 is electrically connected to the main memory 114. The main memory 114 is formed of a memory module acquired by mounting a memory chip on the board. When the memory module is inserted in a connector mounted on the printed wiring board 200, it is electrically connected to the north bridge.

Figure 10:
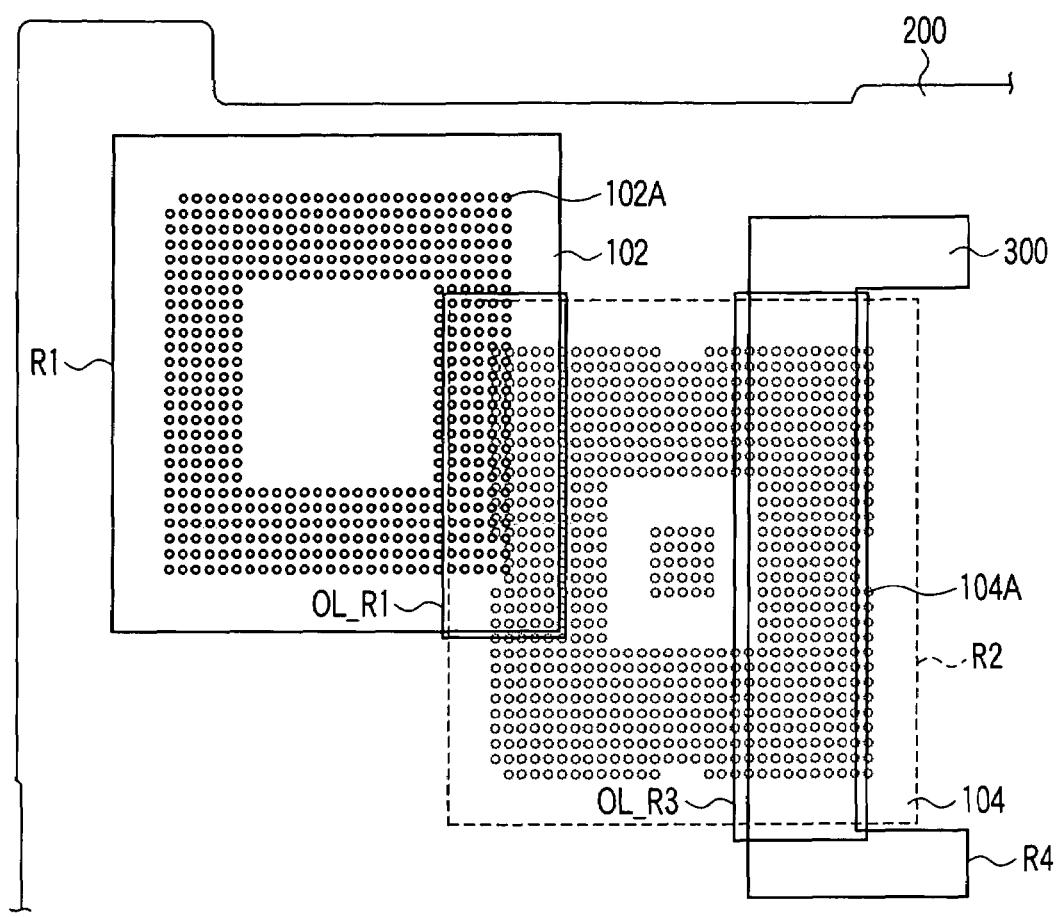
FIG. 10 is an exemplary view illustrating a state in which a connector, into which a memory module is inserted, overlaps with the north bridge.

As shown in FIG. 10, a connector 300, into which the memory module is inserted, is mounted on the printed wiring board 200 in a fourth region R4 that overlaps with the second region R2 of the north bridge 104. In a third overlapping region OL_R3 in which the north bridge 104 overlaps with the connector 300, at least part of the solder balls 104A of the north bridge 104 are electrically connected to at least part of the terminals of the connector 300. By virtue of this structure, the wires can be shortened.

FIG. 11 shows a case where a first radiation mechanism 401 and second radiation mechanism 402 are attached to the CPU 102 and north bridge 104 that have high calorific power, respectively. The printed wiring board 200 has a first attachment hole 403 for attaching the first radiation mechanism 401, a second attachment hole 403 for attaching the second radiation mechanism 402, and a third attachment hole 405 for attaching the first and second radiation mechanisms 401 and 402. The third attachment hole 405 is a common hole for fixing the first and second radiation mechanisms 401 and 402. The use of a single attachment hole as a common attachment hole for the first and second radiation mechanisms 401 and 402 can reduce the dead space and hence secure the wiring area and mounting area.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A printed wiring board comprising:
    a main body including an obverse side with an obverse wiring layer, and a reverse side with a reverse wiring layer;
    first pads provided on the obverse side in a first region defined thereon, and to be connected to terminals arranged on a surface of a first semiconductor chip;
    second pads provided on the reverse side in a second region defined thereon and overlapping with the first region, and to be connected to terminals arranged on a surface of a second semiconductor chip;
    interlayer wiring electrically connecting those of the first pads, which are located in an overlapping region, to those of the second pads which are located in the overlapping region; and
    a first attachment hole formed in the main body, through which a first radiation mechanism provided on the first semiconductor chip is attached to the main body;
    a second attachment hole formed in the main body, through which a second radiation mechanism provided on the second semiconductor chip is attached to the main body; and
    a third attachment hole formed in the main body, through which the first and second radiation mechanisms are attached to the main body.

2. An information processing apparatus comprising:
    a processing unit including first terminals;
    a bridge circuit chip including second terminals; and
    a printed wiring board,
    a first radiation mechanism provided on the processing unit;
    a second radiation mechanism provided on the bridge circuit chip;
    the printed wiring board including:
        a main body including an obverse side with an obverse wiring layer, and a reverse side with a reverse wiring layer, a first attachment hole through which the first radiation mechanism is attached to the main body, a second attachment hole through which a second radiation mechanism is attached to the main body, and a third attachment hole through which the first and second radiation mechanisms are attached to the main body;
        first pads provided on the obverse side in a first region and to be connected to terminals arranged on a surface of the processing unit;
        second pads provided on the reverse side in a second region overlapping with the first region, and to be connected to terminals arranged on a surface of the bridge circuit chip; and
        interlayer wiring electrically connecting those ones of the first pads, which are located in an overlapping region, to those ones of the second pads which are located in the overlapping region.

* * * * *